United States Patent
Von Novak et al.

(10) Patent No.: US 8,559,873 B2
(45) Date of Patent: Oct. 15, 2013

(54) FORWARD LINK SIGNALING WITHIN A WIRELESS POWER SYSTEM

(75) Inventors: William H Von Novak, San Diego, CA (US); Stanley Slavko Toncich, San Diego, CA (US); Cheng F Tan, Denver, CO (US); Kevin D Lee, San Diego, CA (US); Linda S Irish, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 349 days.

(21) Appl. No.: 12/916,352

(22) Filed: Oct. 29, 2010

(65) Prior Publication Data

US 2011/0124305 A1    May 26, 2011

Related U.S. Application Data

(60) Provisional application No. 61/263,269, filed on Nov. 20, 2009.

(51) Int. Cl.
| | |
|---|---|
| *H04B 5/00* | (2006.01) |
| *H04B 1/02* | (2006.01) |
| *H01F 27/42* | (2006.01) |
| *H01F 37/00* | (2006.01) |
| *H01F 38/00* | (2006.01) |

(52) U.S. Cl.
USPC ............. 455/41.1; 455/108; 307/104

(58) Field of Classification Search
USPC ........ 455/39, 41.1, 41.2, 108, 127.1; 307/104, 154; 320/108
See application file for complete search history.

(56) References Cited

U.S. PATENT DOCUMENTS

| | | | |
|---|---|---|---|
| 2006/0181351 A1 | 8/2006 | Ripley | |
| 2007/0021140 A1* | 1/2007 | Keyes et al. | 455/522 |
| 2008/0252254 A1 | 10/2008 | Osada | |
| 2011/0101788 A1* | 5/2011 | Sun et al. | 307/104 |

FOREIGN PATENT DOCUMENTS

| | | |
|---|---|---|
| EP | 2093860 A1 | 8/2009 |
| WO | WO02097972 A2 | 12/2002 |
| WO | WO2007013034 A1 | 2/2007 |

OTHER PUBLICATIONS

I-Hsiu Ho et al: "A Battery-Less Tire Pressure Monitoring System", 2009 IEEE 69th Vehicular Technology Conference; Apr. 26-29, 2009, Barcelona, Spain, IEEE, Piscataway, NJ, USA, Apr. 26, 2009, pp. 1-5, XP031474232, ISBN: 978-1-4244-2517-4.
International Search Report and Written Opinion—PCT/US2010/057681—ISA/EPO—Jun. 9, 2011.

* cited by examiner

Primary Examiner — Nguyen Vo
(74) Attorney, Agent, or Firm — Knobbe, Martens, Olson & Bear LLP

(57) ABSTRACT

Exemplary embodiments are directed to forward link signaling. A method may include modulating an input bias signal of a power amplifier according to data to be transmitted on a wireless power transmit signal. The method may further include modulating an amplitude of the wireless power transmit signal generated by the power amplifier in response to the modulated input bias signal.

24 Claims, 9 Drawing Sheets

FORWARD LINK SIGNALING WITHIN A WIRELESS POWER SYSTEM

CLAIM OF PRIORITY UNDER 35 U.S.C. §119

This application claims priority under 35 U.S.C. §119(e) to:

U.S. Provisional Patent Application 61/263,269 entitled "FORWARD SIGNALING IN A WIRELESS CHARGING SYSTEM" filed on Nov. 20, 2009, the disclosure of which is hereby incorporated by reference in its entirety.

BACKGROUND

1. Field

The present invention relates generally to communication in a wireless power system, and more specifically, to systems, device, and methods for forward link signaling from a transmitter to a receiver in a wireless power system.

2. Background

Approaches are being developed that use over the air power transmission between a transmitter and the device to be charged. These generally fall into two categories. One is based on the coupling of plane wave radiation (also called far-field radiation) between a transmit antenna and receive antenna on the device to be charged which collects the radiated power and rectifies it for charging the battery. Antennas are generally of resonant length in order to improve the coupling efficiency. This approach suffers from the fact that the power coupling falls off quickly with distance between the antennas. So charging over reasonable distances (e.g., >1-2 m) becomes difficult. Additionally, since the system radiates plane waves, unintentional radiation can interfere with other systems if not properly controlled through filtering.

Other approaches are based on inductive coupling between a transmit antenna embedded, for example, in a "charging" mat or surface and a receive antenna plus rectifying circuit embedded in the host device to be charged. This approach has the disadvantage that the spacing between transmit and receive antennas must be very close (e.g. mms). Though this approach does have the capability to simultaneously charge multiple devices in the same area, this area is typically small, hence the user must locate the devices to a specific area.

As will be appreciated by a person having ordinary skill in the art, wireless power systems may be configured to enable communication between a transmitter and a receiver. Conventional communication methods of wireless power systems may include out-of-band communication or detuning a receiver, a transmitter, or both. A need exists to enhance communication between a transmitter and a receiver in a wireless power system.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

The term "wireless power" is used herein to mean any form of energy associated with electric fields, magnetic fields, electromagnetic fields, or otherwise that is transmitted between a transmitter to a receiver without the use of physical electrical conductors.

Figure 1:
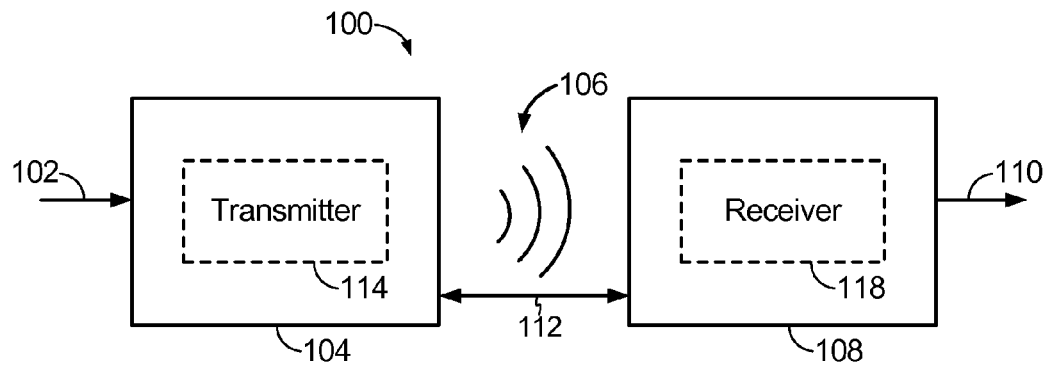
FIG. 1 shows a simplified block diagram of a wireless power transfer system.

FIG. 1 illustrates a wireless transmission or charging system 100, in accordance with various exemplary embodiments of the present invention. Input power 102 is provided to a transmitter 104 for generating a radiated field 106 for providing energy transfer. A receiver 108 couples to the radiated field 106 and generates an output power 110 for storing or consumption by a device (not shown) coupled to the output power 110. Both the transmitter 104 and the receiver 108 are separated by a distance 112. In one exemplary embodiment, transmitter 104 and receiver 108 are configured according to a mutual resonant relationship and when the resonant frequency of receiver 108 and the resonant frequency of transmitter 104 are very close, transmission losses between the transmitter 104 and the receiver 108 are minimal when the receiver 108 is located in the "near-field" of the radiated field 106.

Transmitter 104 further includes a transmit antenna 114 for providing a means for energy transmission and receiver 108 further includes a receive antenna 118 for providing a means for energy reception. The transmit and receive antennas are sized according to applications and devices to be associated therewith. As stated, an efficient energy transfer occurs by coupling a large portion of the energy in the near-field of the transmitting antenna to a receiving antenna rather than propagating most of the energy in an electromagnetic wave to the far field. When in this near-field a coupling mode may be developed between the transmit antenna 114 and the receive antenna 118. The area around the antennas 114 and 118 where this near-field coupling may occur is referred to herein as a coupling-mode region.

Figure 2:
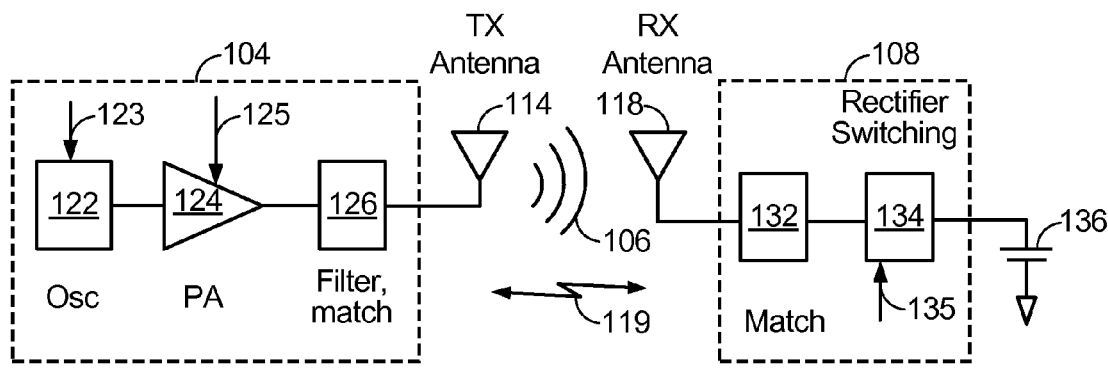
FIG. 2 shows a simplified schematic diagram of a wireless power transfer system.

FIG. 2 shows a simplified schematic diagram of a wireless power transfer system. The transmitter 104 includes an oscillator 122, a power amplifier 124 and a filter and matching circuit 126. The oscillator is configured to generate a signal at a desired frequency, which may be adjusted in response to adjustment signal 123. The oscillator signal may be amplified by the power amplifier 124 with an amplification amount responsive to control signal 125. The filter and matching circuit 126 may be included to filter out harmonics or other unwanted frequencies and match the impedance of the transmitter 104 to the transmit antenna 114.

The receiver 108 may include a matching circuit 132 and a rectifier and switching circuit 134 to generate a DC power output to charge a battery 136 as shown in FIG. 2 or power a device coupled to the receiver (not shown). The matching circuit 132 may be included to match the impedance of the receiver 108 to the receive antenna 118. The receiver 108 and transmitter 104 may communicate on a separate communication channel 119 (e.g., Bluetooth, zigbee, cellular, etc).

Figure 3:
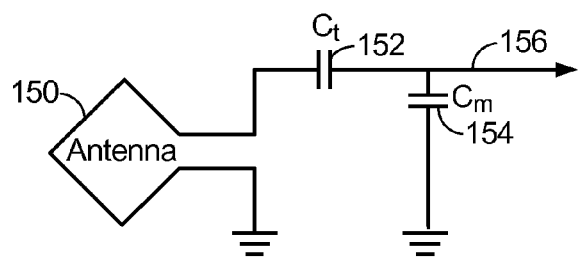
FIG. 3 illustrates a schematic diagram of a loop antenna for use in exemplary embodiments of the present invention.

As illustrated in FIG. 3, antennas used in exemplary embodiments may be configured as a "loop" antenna 150, which may also be referred to herein as a "magnetic" antenna. Loop antennas may be configured to include an air core or a physical core such as a ferrite core. Air core loop antennas may be more tolerable to extraneous physical devices placed in the vicinity of the core. Furthermore, an air core loop antenna allows the placement of other components within the core area. In addition, an air core loop may more readily enable placement of the receive antenna 118 (FIG. 2) within a plane of the transmit antenna 114 (FIG. 2) where the coupled-mode region of the transmit antenna 114 (FIG. 2) may be more powerful.

As stated, efficient transfer of energy between the transmitter 104 and receiver 108 occurs during matched or nearly matched resonance between the transmitter 104 and the receiver 108. However, even when resonance between the transmitter 104 and receiver 108 are not matched, energy may be transferred, although the efficiency may be affected. Transfer of energy occurs by coupling energy from the near-field of the transmitting antenna to the receiving antenna residing in the neighborhood where this near-field is established rather than propagating the energy from the transmitting antenna into free space.

The resonant frequency of the loop or magnetic antennas is based on the inductance and capacitance. Inductance in a loop antenna is generally simply the inductance created by the loop, whereas, capacitance is generally added to the loop antenna's inductance to create a resonant structure at a desired resonant frequency. As a non-limiting example, capacitor 152 and/or capacitor 154 may be added to the antenna to create a resonant circuit that generates resonant signal 156. Those of ordinary skill in the art realize that the tuning circuit shown need not consist of just capacitors 152 and/or 154, but may be a more complex structure consisting of inductors as well, with the object of performing further impedance transformation. Accordingly, for larger diameter loop antennas, the size of capacitance needed to induce resonance decreases as the diameter or inductance of the loop increases. Furthermore, as the diameter of the loop or magnetic antenna increases, the efficient energy transfer area of the near-field increases. Of course, other resonant circuits are possible. As another non-limiting example, a capacitor may be placed in parallel between the two terminals of the loop antenna. In addition, those of ordinary skill in the art will recognize that for transmit antennas the resonant signal 156 may be an input to the loop antenna 150.

Figure 4:
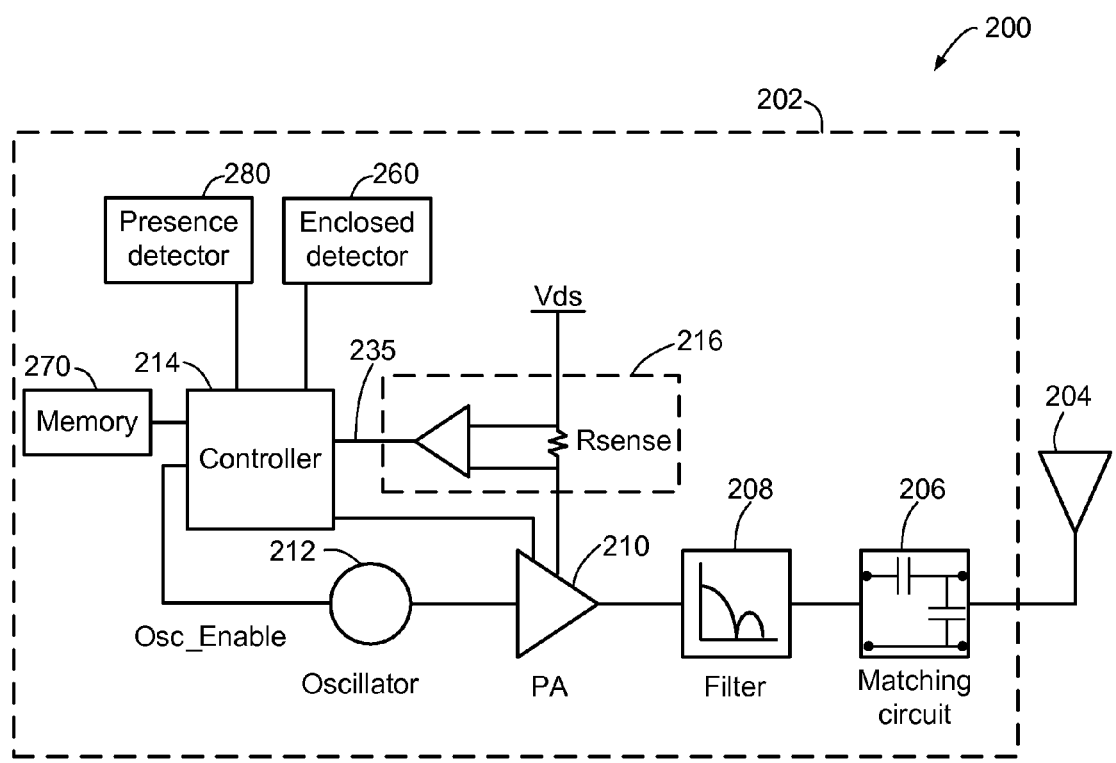
FIG. 4 is a simplified block diagram of a transmitter, in accordance with an exemplary embodiment of the present invention.

FIG. 4 is a simplified block diagram of a transmitter 200, in accordance with an exemplary embodiment of the present invention. The transmitter 200 includes transmit circuitry 202 and a transmit antenna 204. Generally, transmit circuitry 202 provides RF power to the transmit antenna 204 by providing an oscillating signal resulting in generation of near-field energy about the transmit antenna 204. It is noted that transmitter 200 may operate at any suitable frequency. By way of example, transmitter 200 may operate at the 13.56 MHz ISM band.

Exemplary transmit circuitry 202 includes a fixed impedance matching circuit 206 for matching the impedance of the transmit circuitry 202 (e.g., 50 ohms) to the transmit antenna 204 and a low pass filter (LPF) 208 configured to reduce harmonic emissions to levels to prevent self-jamming of devices coupled to receivers 108 (FIG. 1). Other exemplary embodiments may include different filter topologies, including but not limited to, notch filters that attenuate specific frequencies while passing others and may include an adaptive impedance match, that can be varied based on measurable transmit metrics, such as output power to the antenna or DC current drawn by the power amplifier. Transmit circuitry 202 further includes a power amplifier 210 configured to drive an RF signal as determined by an oscillator 212. The transmit circuitry may be comprised of discrete devices or circuits, or alternately, may be comprised of an integrated assembly. An exemplary RF power output from transmit antenna 204 may be on the order of 2.5 Watts, or higher, depending on charging applications Transmit circuitry 202 further includes a controller 214 for enabling the oscillator 212 during transmit phases (or duty cycles) for specific receivers, for adjusting the frequency or phase of the oscillator, and for adjusting the output power level for implementing a communication protocol for interacting with neighboring devices through their attached receivers. As is well known in the art, adjustment of oscillator phase and related circuitry in the transmission path allows for reduction of out of band emissions, especially when transitioning from one frequency to another.

The transmit circuitry 202 may further include a load sensing circuit 216 for detecting the presence or absence of active receivers in the vicinity of the near-field generated by transmit antenna 204. By way of example, a load sensing circuit 216 monitors the current flowing to the power amplifier 210, which is affected by the presence or absence of active receivers in the vicinity of the near-field generated by transmit antenna 204. Detection of changes to the loading on the power amplifier 210 are monitored by controller 214 for use in determining whether to enable the oscillator 212 for transmitting energy and to communicate with an active receiver.

Transmit antenna 204 may be implemented with a Litz wire or as an antenna strip with the thickness, width and metal type selected to keep resistive losses low. In a conventional implementation, the transmit antenna 204 can generally be configured for association with a larger structure such as a table, mat, lamp or other less portable configuration. Accordingly, the transmit antenna 204 generally will not need "turns" in order to be of a practical dimension. An exemplary implementation of a transmit antenna 204 may be "electrically small" (i.e., fraction of the wavelength) and tuned to resonate at lower usable frequencies by using capacitors to define the resonant frequency. In an exemplary application where the transmit antenna 204 may be larger in diameter, or length of side if a square loop, (e.g., 0.50 meters) relative to the receive antenna, the transmit antenna 204 will not necessarily need a large number of turns to obtain a reasonable capacitance.

The transmitter 200 may gather and track information about the whereabouts and status of receiver devices that may be associated with the transmitter 200. Thus, the transmitter circuitry 202 may include a presence detector 280, an enclosed detector 290, or a combination thereof, connected to the controller 214 (also referred to as a processor herein). The controller 214 may adjust an amount of power delivered by the amplifier 210 in response to presence signals from the presence detector 280 and the enclosed detector 290. The transmitter may receive power through a number of power sources, such as, for example, an AC-DC converter (not shown) to convert conventional AC power present in a building, a DC-DC converter (not shown) to convert a conventional DC power source to a voltage suitable for the transmitter 200, or directly from a conventional DC power source (not shown).

Various exemplary embodiments of the present invention, as described herein, relate to systems, devices, and methods for communication between a transmitter and a receiver in a wireless power system. More specifically, various exemplary embodiments described herein include methods, systems, and devices for forward signaling (i.e., signaling from a transmitter to a receiver) in a wireless power system. According to one or more exemplary embodiments described herein, an output of a power amplifier of a wireless power transmitter may be modulated to enable a forward link signal (i.e., a message) to be transmitted from the transmitter to an associated receiver.

Figure 5A:
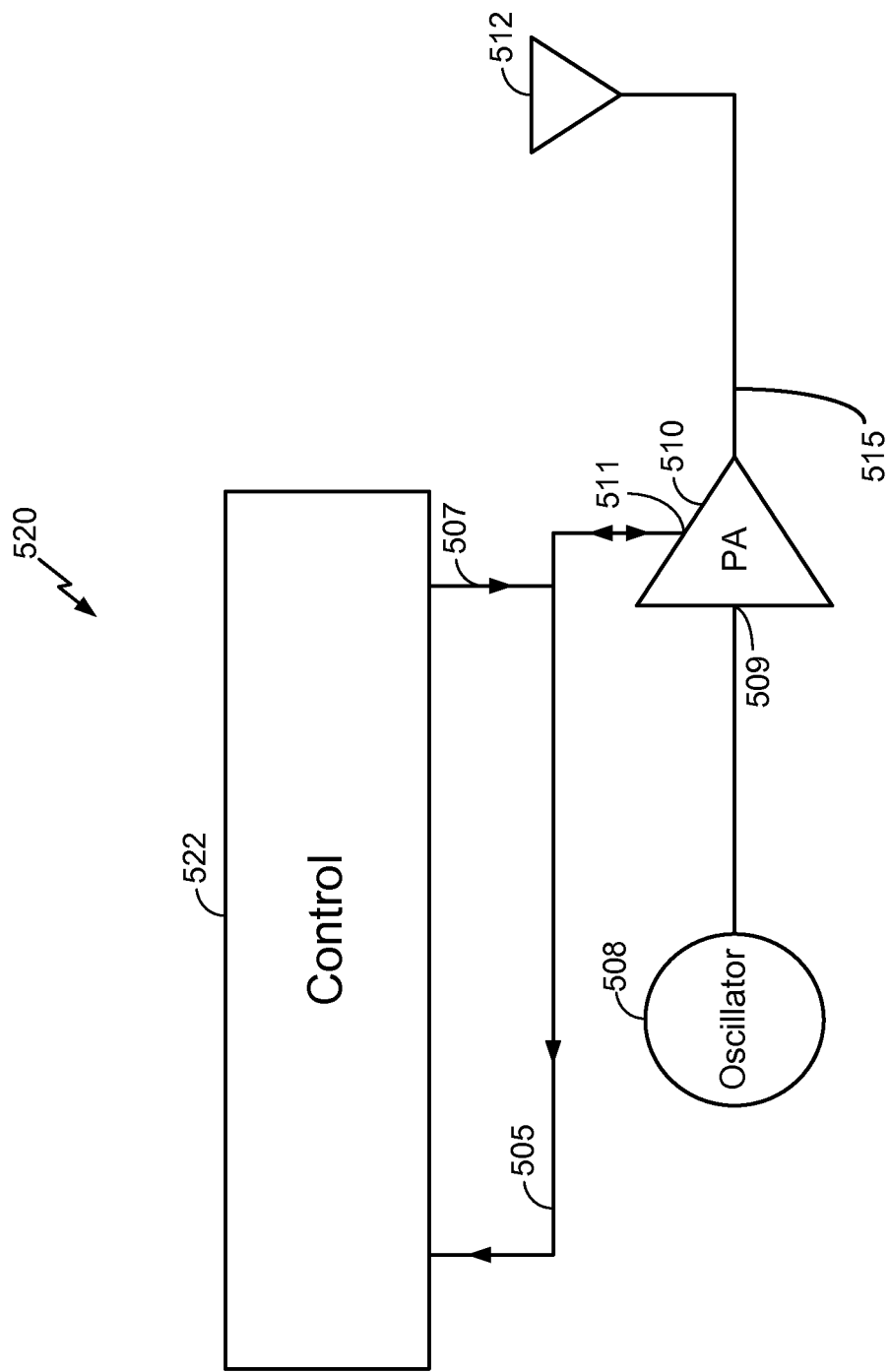
FIG. 5A illustrates a simplified block diagram of a portion of a transmitter, in accordance with an exemplary embodiment of the present invention.

FIG. 5A illustrates a simplified block diagram of a portion of a transmitter 520, in accordance with an exemplary embodiment of the present invention. Transmitter 520, which may comprise a wireless power transmitter, may include a control unit 522, an oscillator 508, a power amplifier (PA) 510, and an antenna 512. As illustrated in FIG. 5A, control unit 522 may be coupled to a bias input 511 of power amplifier 510 and oscillator 508 may be coupled to an input 509 of power amplifier 510. Moreover, an output 515 of power amplifier 510 may be coupled to antenna 512. As note below, control unit 522 may be configured to sense a power level of power amplifier 510 via a signal 505 and convey a signal to power amplifier 510 via a signal 507. According to an exemplary embodiment of the present invention, transmitter 520 may be configured to transmit a forward link signal to an associated receiver via modulation of an output signal of power amplifier 510.

As will be appreciated by a person having ordinary skill in the art, power levels of a power amplifier within a wireless power transmitter may change in response to loading changes on the transmitter. For example, the loading on a transmitter while the transmitter is transmitting wireless power to a single wireless power receiver may be different that a loading on the transmitter while the transmitter is transmitting wireless power to multiple wireless power receivers. Accordingly, control unit 522 may be configured to determine a power level of power amplifier 510. More specifically, control unit 522 may be configured to determine a power level of power amplifier 510 by detecting, via signal 505, one or more properties (e.g., a voltage, a current, or both) of power amplifier 510. Upon determining a power level of power amplifier 510, control unit 522 may be calibrated in accordance with the determined power level to enable control unit 522 to generate a signal 507 at suitable power levels and in accordance with a desired forward link signal.

Furthermore, control unit 522 may be configured to convey a signal (e.g., a DC power signal) to bias input 511 of power amplifier 510 via signal 507. More specifically, control unit 522 may modulate an amplitude of the signal conveyed to bias input 511 of power amplifier 510. It is noted that the signal, which is conveyed to bias input 511 of power amplifier 510, may be modulated in a manner to enable transmitter 520 to send a desired forward link signal to a receiver (not shown in FIG. 5A). It is further noted that the power levels of the signal sent from control unit 522 to bias input 511 of power amplifier 510 may be at least partially based on the detected power level of power amplifier 510.

By way of example only and, as described more fully below, control unit 522 may include a controller, such as a microcontroller, one or more converters (e.g., a digital to analog converter, a DC-to-DC converter, or both), and a feedback unit configured to detect the one or more properties at power amplifier 510. By way of example only, the feedback unit may be configured to detect a voltage, a current, or both at power amplifier 510.

As will be appreciated by a person having ordinary skill in the art, oscillator 508 may be configured to convey a signal to input 509 of power amplifier 510. Moreover, an output of power amplifier 510 may be conveyed to antenna 512, which may be configured to wirelessly transmit RF energy within an associated near-field. As noted above, in accordance with an exemplary embodiment of the present invention, an amplitude of the signal conveyed to bias input 511 of power amplifier 510 may be modulated. Furthermore, according to an exemplary embodiment of the present invention, the output of power amplifier 510 may be modulated in response to the amplitude modulation performed on the signal conveyed to bias input 511 of power amplifier 510.

Figure 5B:
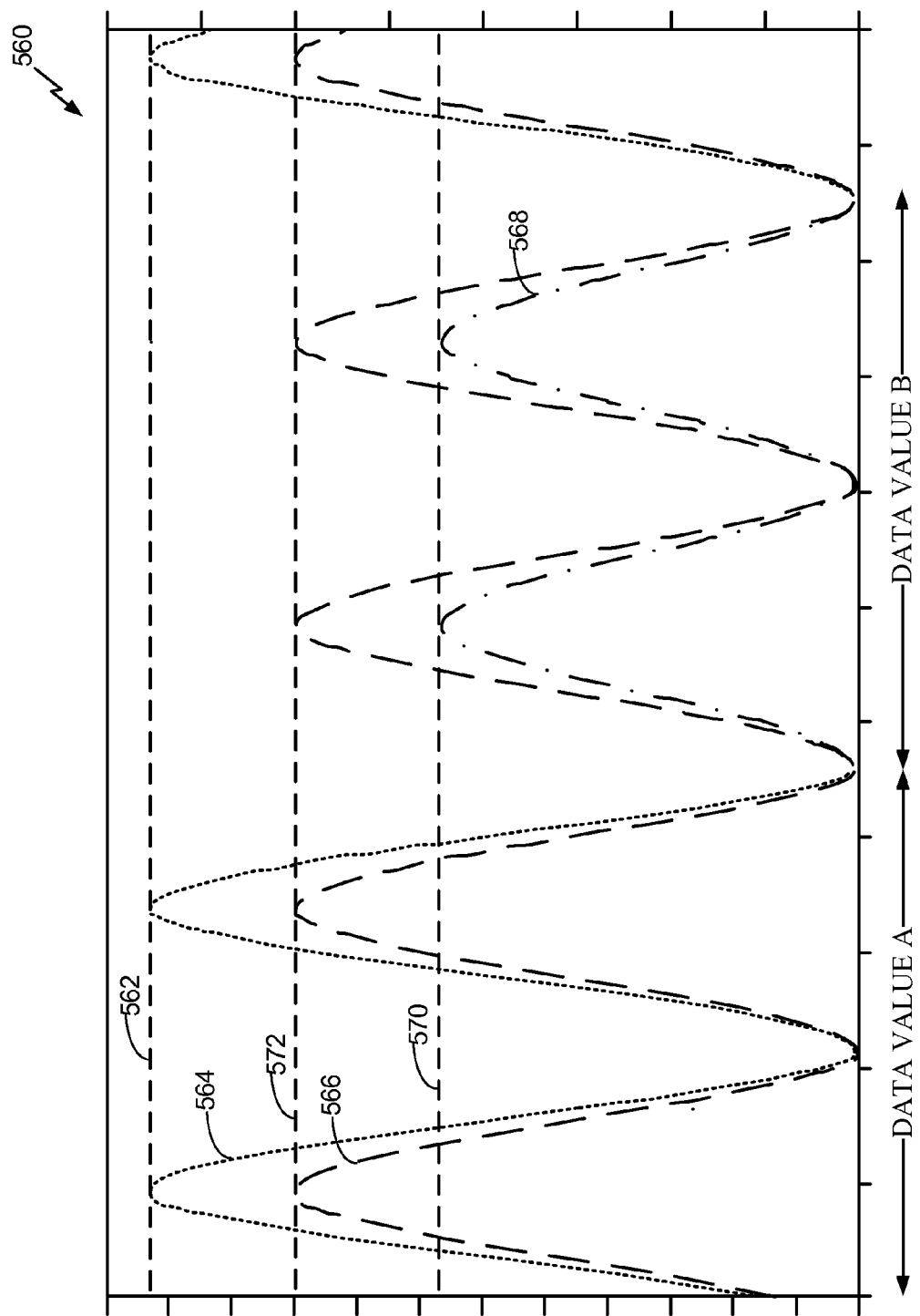
FIG. 5B illustrates a plot of a plurality of signals output from a power amplifier, in accordance with an exemplary embodiment of the present invention.

FIG. 5B illustrates a plot 560 depicting a signal 566, a signal 564, and a signal 568. With reference to FIGS. 5A and 5B, signal 566 represents output 515 of power amplifier 510, wherein signal 566, which has an amplitude level represented by reference numeral 572, is not modulated (i.e., a bias signal is not applied to input 511). Signal 564 represents an output of power amplifier 510, wherein signal 564, which has an amplitude level represented by reference numeral 562, is modulated with respect to signal 566 (i.e., a bias signal indicative of data value A is applied to input 511). Signal 568 represents an output of power amplifier 510, wherein signal 568, which has an amplitude level represented by reference numeral 570, is modulated with respect to signal 566 (i.e., a bias signal indicative of data value B is applied to input 511).

Figure 6:
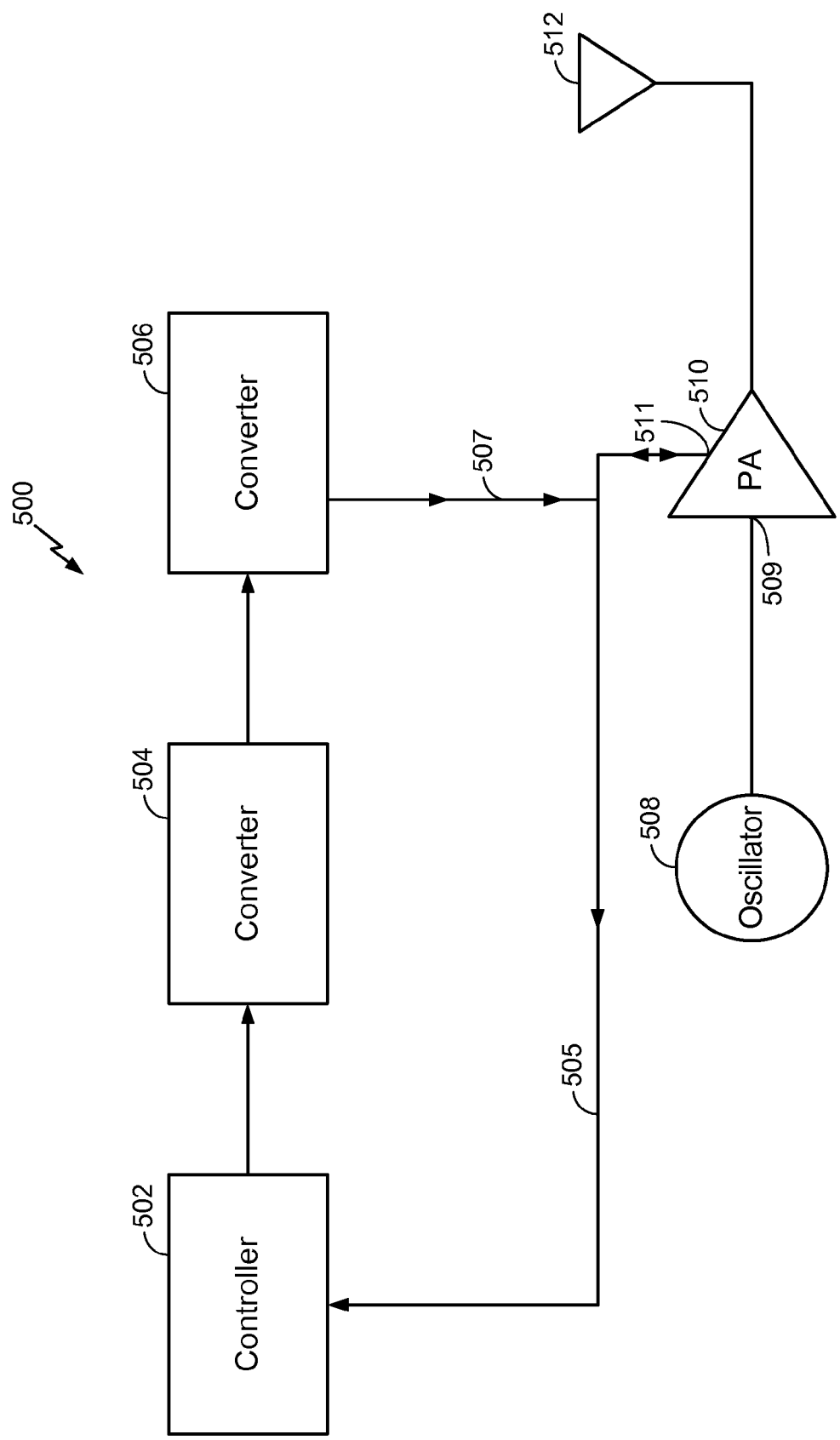
FIG. 6 illustrates a block diagram of a portion of a transmitter, in accordance with an exemplary embodiment of the present invention.

FIG. 6 is a more specific illustration of a transmitter 500 including a controller 502 and power amplifier 510, according to an exemplary embodiment of the present invention. By way of example only, controller 502 may comprise a microcontroller. Transmitter 500 further includes a converter 504 and a converter 506. Similarly to transmitter 520 illustrated in FIG. 5A, controller 502 may comprise a feedback unit (not shown in FIG. 6) and may be configured to, via signal 505, determine a power level of power amplifier. As an example, controller 502 may be configured to detect one or more properties at power amplifier 510. By way of example only, controller 502 may be configured to determine a power level of power amplifier 510 by detecting a voltage, a current, or both at power amplifier 510.

Converter 504 may comprise a digital potentiometer (POT), a digital to analog converter, or a combination thereof. Converter 506 may comprise, for example only, a DC-to-DC converter. As illustrated in FIG. 6, an output of controller 502 is coupled to converter 504 and an output of converter 504 is coupled to an input of converter 506. Moreover, an output of converter 506 is coupled to bias input 511 of power amplifier 510. During a contemplated operation of transmitter 500, controller 502 may sense a power level at power amplifier 510 and, in response thereto, may determine a magnitude, at any point in time, of a signal to be conveyed to converter 504. Thereafter, controller 502 may convey a digital amplitude signal, having an amplitude that may vary with time, to converter 504. Converter 504, in response to receiving the digital amplitude signal, may convey an analog signal to converter 506. Converter 506 may then convey a DC power signal to bias input 511 of power amplifier 510. Furthermore, oscillator 508 may convey a signal to input 509 of power amplifier 510. As will be appreciated by a person having ordinary skill in the art, power amplifier 510 may output a signal, which is modulated by the DC power signal supplied to bias input 511 of power amplifier 510.

Figure 7:
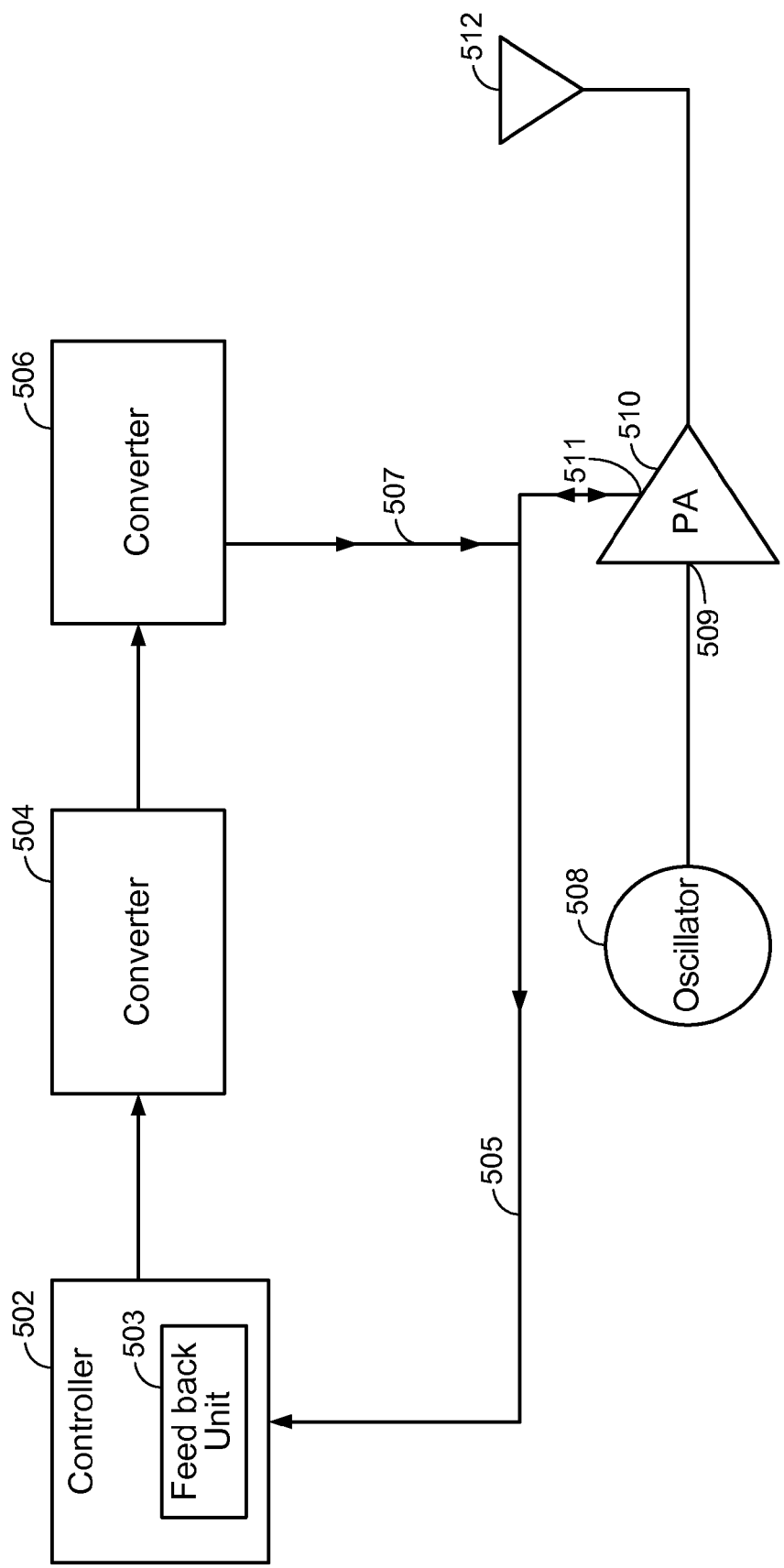
FIG. 7 illustrates another block diagram of a portion of a transmitter, in accordance with an exemplary embodiment of the present invention.

With reference to FIG. 7, a feedback unit 503 is depicted within controller 502. As previously noted, a feedback unit (e.g., feedback unit 503) may be configured to detect, via signal 505, a power level of an associated power amplifier (e.g., power amplifier 510). Further, as noted above, power levels of a power amplifier within a wireless power transmitter may change in response to loading changes on the transmitter. Accordingly, feedback unit 503 may be configured to sense a power level of power amplifier 510. More specifically, feedback unit 503 may be configured to detect one or more properties at bias input 511 of power amplifier 510. For example only, feedback unit 503 may be configured to detect a voltage at power amplifier 510, a current at power amplifier 510, or both. Furthermore, in response to a detected voltage, a detected current, or both, controller 502 may adjust a magnitude of signal 524 conveyed to converter 504. Although feedback unit 503 is illustrated in FIG. 7 as being positioned within controller 502, embodiments of the present invention are not so limited. Rather, as an example illustrated in FIG. 8, feedback unit 503 may be separate from controller 502.

Figure 8:
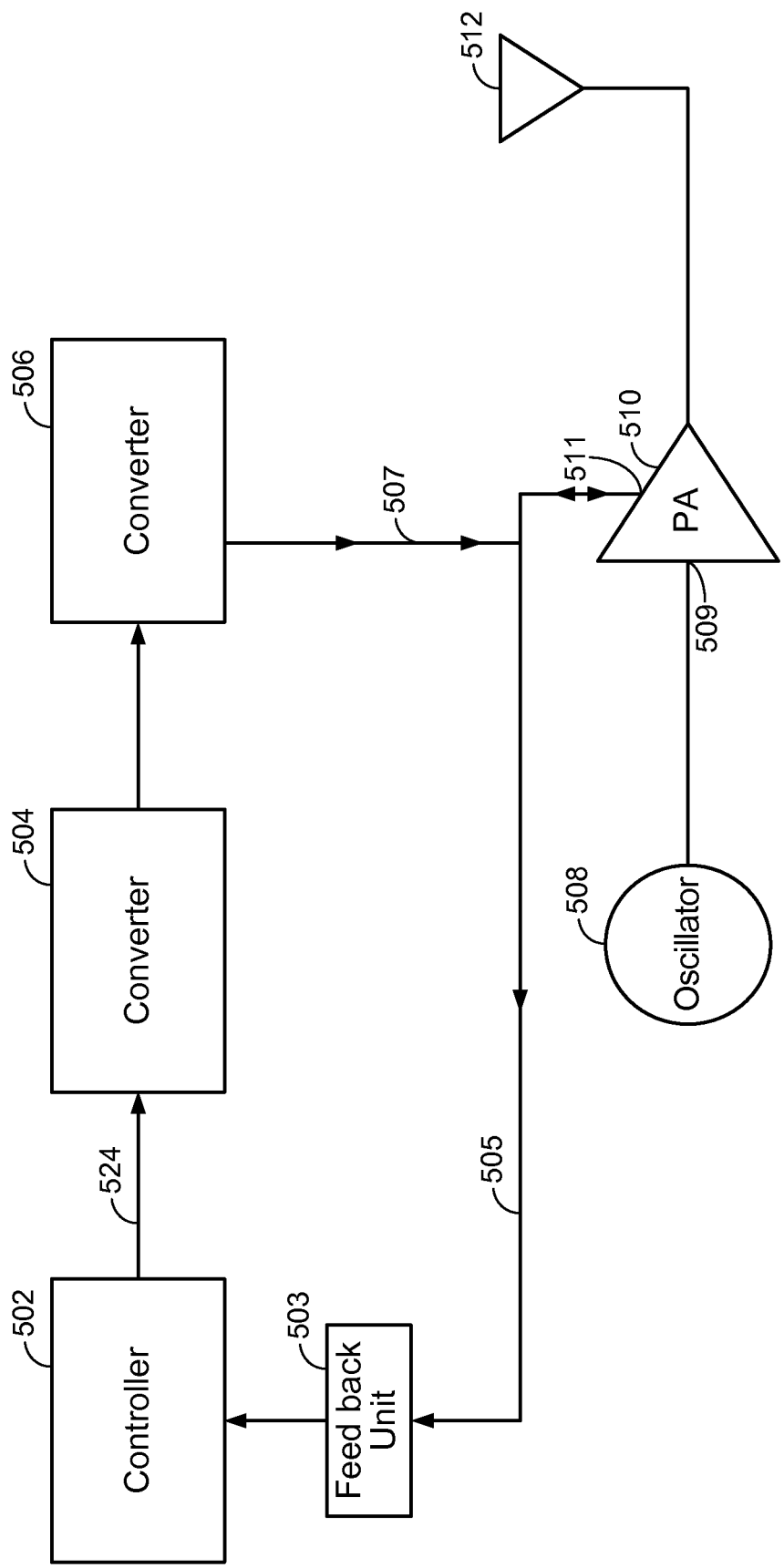
FIG. 8 illustrates yet another block diagram of a portion of a transmitter, in accordance with an exemplary embodiment of the present invention.

In the embodiment illustrated in FIG. 8, feedback unit 503 may be configured to detect, via signal 505, a power level of power amplifier 510. According to one example, feedback unit 503 may be configured to detect one or more properties (e.g., a voltage and/or a current) at the bias input of power amplifier 510. Moreover, feedback unit 503 may be configured to convey a signal indicative of the detected power level (e.g., one or more properties) of power amplifier 510 to controller 502. In response to receiving a signal from feedback unit 503, controller 502 may determine a magnitude, at each point in time, of a digital amplitude signal to be conveyed to converter 504. Further, controller 502 may convey the digital amplitude signal, having an amplitude that may vary with time, to converter 504. In response thereto, converter 504 may convey an analog signal to converter 506. Converter 506 may then convey a DC power signal to bias input 511 of power amplifier 510. Furthermore, oscillator 508 may convey a signal to input 509 of power amplifier 510. As will be appreciated by a person having ordinary skill in the art, power amplifier 510 may output a signal, which is modulated by the DC power signal supplied from controller 506 to bias input 511 of power amplifier 510.

Figure 9:
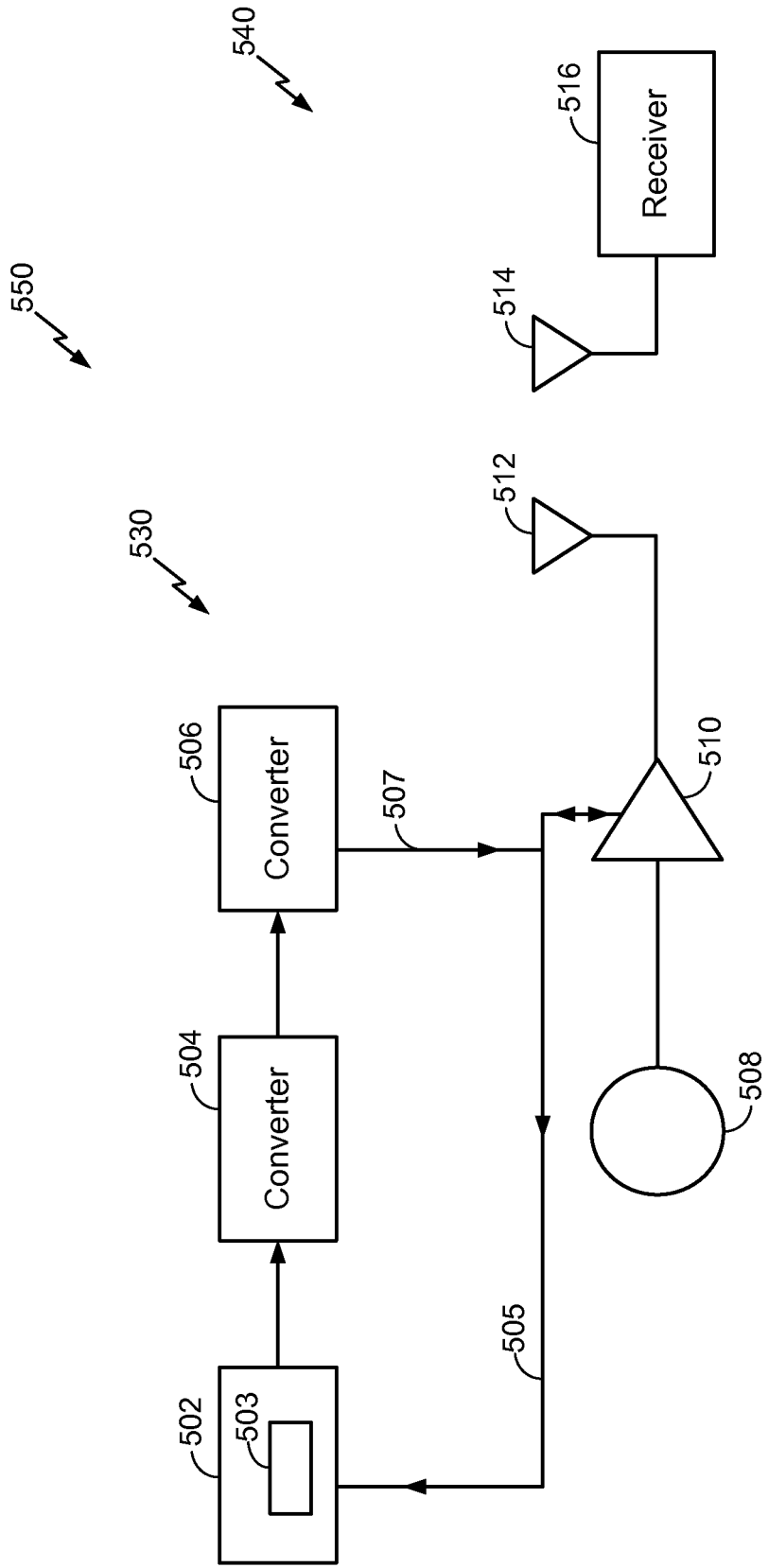
FIG. 9 illustrates a system including a portion of a transmitter and a portion of a receiver, in accordance with an exemplary embodiment of the present invention.

FIG. 9 illustrates a system 550 including a portion of a transmitter 530 and a portion of a receiver 540. Transmitter 530 may be configured to wirelessly transmit RF energy to receiver 540, which is positioned within a near-field region of transmitter 530. Furthermore, transmitter 530 may be able to communicate with receiver 540 according to one or more the exemplary embodiments described herein. It is noted that although system 550 resembles the transmitter illustrated in FIG. 8, system 550 may comprise any transmitter configuration described herein (e.g., the transmitter illustrated in FIG. 5A, FIG. 6, or FIG. 7)

Figure 10:
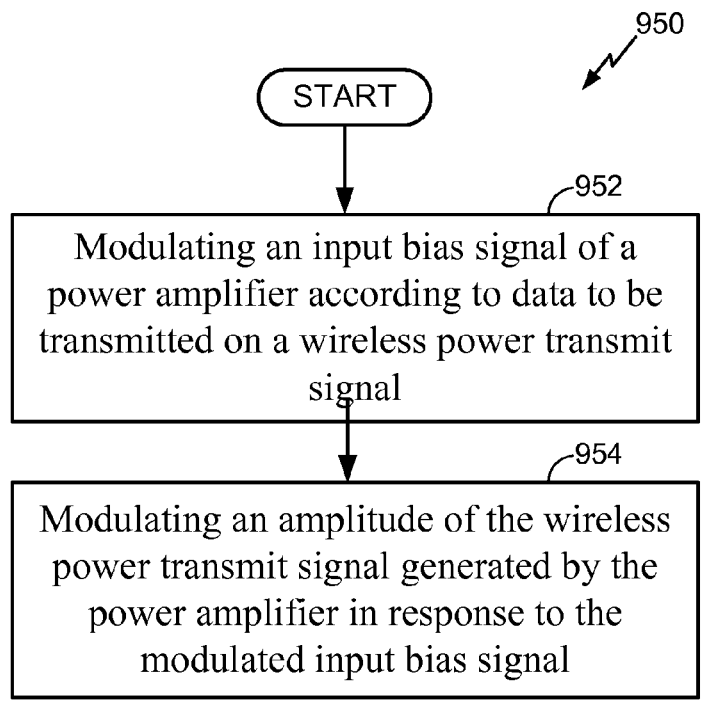
FIG. 10 is a flowchart illustrating a method, in accordance with an exemplary embodiment of the present invention.

FIG. 10 is a flowchart illustrating another method 950, in accordance with one or more exemplary embodiments. Method 950 may include modulating an input bias signal of a power amplifier according to data to be transmitted on a wireless power transmit signal (depicted by numeral 952). Method 950 may further include modulating an amplitude of the wireless power transmit signal generated by the power amplifier in response to the modulated input bias signal (depicted by numeral 954).

Figure 11:
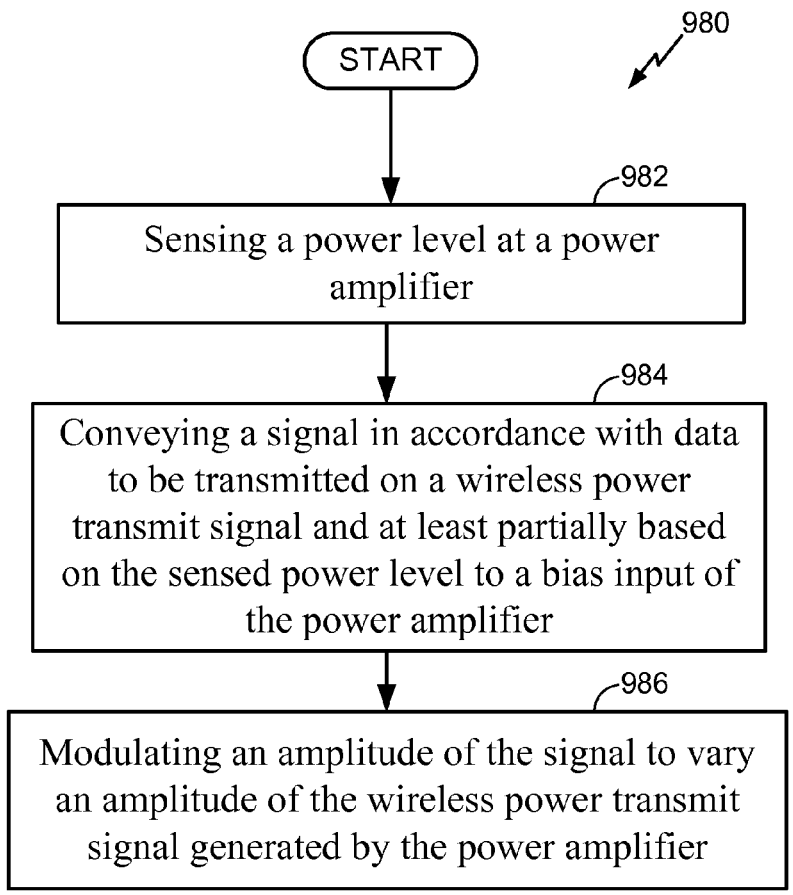
FIG. 11 is a flowchart illustrating another method, in accordance with an exemplary embodiment of the present invention.

FIG. 11 is a flowchart illustrating another method 980, in accordance with one or more exemplary embodiments. Method 980 may include sensing a power level at a power amplifier (depicted by numeral 982). Method 980 may further include conveying a signal in accordance with data to be transmitted on a wireless power transmit signal and at least partially based on the sensed power level to a bias input of the power amplifier (depicted by numeral 984). Further, method 980 may include modulating an amplitude of the signal to vary an amplitude of the wireless power transmit signal generated by the power amplifier. (depicted by numeral 986).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method for wirelessly transferring power and data, comprising:
    modulating an amplitude of an input bias signal of a power amplifier according to data for transmission on a power transmit signal; and
    amplifying, with the power amplifier, the power transmit signal based on the modulated input bias signal; and
    wirelessly transmitting the power transmit signal, amplified based on the modulated input bias signal, with a transmit antenna configured to wirelessly transmit energy within a field at a level sufficient to charge or power a device coupled to a receiver.

2. The method of claim 1, further comprising sensing a power level at the power amplifier, wherein a power level of the input bias signal is at least partially based on the sensed power level at the power amplifier.

3. The method of claim 1, wherein modulating the amplitude of the input bias signal comprises generating a digital amplitude signal at a controller and conveying the input bias signal as a modulated DC power signal to the power amplifier.

4. The method of claim 1, wherein modulating the amplitude of the input bias signal comprises conveying a digital amplitude signal to at least one converter to generate a DC power signal as the input bias signal.

5. The method of claim 1, wherein the wireless power transfer field corresponds to a near-field region of the transmit antenna.

6. A device for wirelessly transferring power and data, comprising:
    means for modulating an amplitude of an input bias signal of a power amplifier according to data for transmission on a power transmit signal;
    means for amplifying the power transmit signal based on the modulated input bias signal; and
    means for generating a wireless power transfer field at a level sufficient to charge or power an apparatus coupled to a receiver in response to receiving the amplified power transmit signal.

7. The device of claim 6, further comprising means for sensing a power level of the means for amplifying the power transmit signal.

8. The device of claim 7, the amplitude of the input bias signal is modulated at least partially based on the sensed power level.

9. The device of claim 7, wherein the means for sensing a power level comprises means for detecting at least one of a voltage of the amplifying means and a current of the amplifying means.

10. The device of claim 6, further comprising means for generating a digital amplitude signal according to the data for transmisson.

11. The device of claim 10, further comprising:
    means for converting the digital amplitude signal to an analog signal; and
    means for generating the input bias signal based on the analog signal.

12. The device of claim 11, wherein the means for converting comprises a digital potentiometer (POT) or a digital to analog converter and the means for generating the input bias signal based on the analog signal comprises a DC-to-DC converter.

13. The device of claim 6, wherein the wireless power transfer field corresponds to a near-field region of a transmit antenna.

14. The device of claim 6, wherein the level of the wireless power transfer field is 2.5 Watts or greater.

15. The device of claim 6, wherein the means modulating the amplitude of the input bias signal comprises a control unit and wherein the means for amplifying the power transmit signal comprises a power amplifier, and wherein the means for generating the wireless power transfer field comprises a transmit antenna.

16. A wireless power transmitter, comprising:
    a power amplifier;
    a control unit configured to modulate an amplitude of an input bias signal of the power amplifier according to data for transmission on a power transmit signal, wherein the power amplifier is configured to amplify the power transmit signal based on the modulated input bias signal; and a transmit antenna configured to generate a wireless power transfer field at a level sufficient to charge or power an apparatus coupled to a receiver in response to receiving the amplified power transmit signal.

17. The wireless power transmitter of claim 16, wherein the control unit is further configured to detect a power level of the power amplifier.

18. The wireless power transmitter of claim 17, wherein the control unit is further configured to determine the amplitude of the input bias signal at least partially based on the detected power level of the power amplifier.

19. The wireless power transmitter of claim 16, wherein the control unit is configured to generate a digital amplitude signal according to the data for transmission.

20. The wireless power transmitter of claim 19, wherein the control unit further comprises a first converter configured to convert the digital amplitude signal to an analog signal.

21. The wireless power transmitter of claim 20, wherein the control unit further comprises a second converter configured to receive the analog signal and generate the input bias signal based on the analog signal.

22. The wireless power device of claim 21, wherein the first converter comprises a digital potentiometer (POT) or a digital to analog converter and the second converter comprises a DC-to-DC converter.

23. The wireless power transmitter of claim 16, wherein the control unit comprises a microcontroller.

24. The wireless power transmitter of claim 16, wherein the wireless transfer field corresponds to a near-field region of the transmit antenna.

* * * * *